US008680407B1

(12) United States Patent
Chan

(10) Patent No.: US 8,680,407 B1
(45) Date of Patent: Mar. 25, 2014

(54) MODULAR ENCLOSURE ASSEMBLY FOR TERMINALS WIRING AND DISTRIBUTION

(71) Applicant: James Chun-Nam Chan, Richmond (CA)

(72) Inventor: James Chun-Nam Chan, Richmond (CA)

(73) Assignee: VPL Enterprises Ltd., Langley, BC (CA)

( * ) Notice: Subject to any disclaimer, the term of this patent is extended or adjusted under 35 U.S.C. 154(b) by 0 days.

(21) Appl. No.: 13/573,714

(22) Filed: Oct. 4, 2012

(51) Int. Cl.
*H05K 5/02* (2006.01)

(52) U.S. Cl.
USPC .............. 174/560; 174/561; 174/563; 174/50

(58) Field of Classification Search
USPC ........................ 174/50, 53, 559, 560, 561, 563
See application file for complete search history.

(56) References Cited

U.S. PATENT DOCUMENTS

| | | | | |
|---|---|---|---|---|
| 3,066,244 A | * | 11/1962 | Defandorf et al. | 174/560 |
| 4,428,492 A | * | 1/1984 | Jorgensen | 220/3.94 |
| 5,574,255 A | * | 11/1996 | Simmons | 174/53 |
| 5,619,013 A | * | 4/1997 | Jorgensen | 174/53 |
| 5,703,327 A | * | 12/1997 | Jorgensen | 174/53 |
| 6,229,087 B1 | * | 5/2001 | Archer | 174/50 |
| 6,576,835 B1 | * | 6/2003 | Ford et al. | 174/50 |
| 6,903,272 B2 | * | 6/2005 | Dinh | 174/58 |
| 6,999,305 B1 | * | 2/2006 | Calcote | 361/601 |
| 8,212,144 B1 | * | 7/2012 | Gretz | 174/58 |
| 8,253,016 B1 | * | 8/2012 | Baldwin et al. | 174/50 |
| 2006/0005985 A1 | * | 1/2006 | L'Henaff et al. | 174/50 |
| 2012/0285717 A1 | * | 11/2012 | Shumate et al. | 174/50 |
| 2012/0305307 A1 | * | 12/2012 | Korcz et al. | 174/562 |
| 2013/0098653 A1 | * | 4/2013 | Maccarone | 174/50 |

* cited by examiner

*Primary Examiner* — Hoa C Nguyen
*Assistant Examiner* — Amol Patel
(74) *Attorney, Agent, or Firm* — Frederick Kaufman

(57) ABSTRACT

A modular enclosure assembly comprising: an upper and lower enclosure subassemblies, interconnected by a partial interpenetration, and a pair of hinged panel subassemblies for opening/closing the inner space of the enclosure subassemblies. Each of the enclosure subassemblies incorporates a back base plate having a first interpenetrating zone, located at an end of a lower left side of the back base plate, and a second interpenetrating zone, located at an end of a lower right side of the back base plate and juxtaposed with the first interpenetrating zone. The second interpenetrating zone incorporates a slat partially superposed on a rear surface of the back base plate where and with which this second interpenetrating zone forms a monoblock structure and from which the slat extends downwardly, beyond the rear surface of the back base plate.

3 Claims, 16 Drawing Sheets

US 8,680,407 B1

MODULAR ENCLOSURE ASSEMBLY FOR TERMINALS WIRING AND DISTRIBUTION

I. BACKGROUND OF THE INVENTION

1. Definition of the Invention

The present invention refers, in general, to enclosures for terminals wiring and distribution and, more particularly, to a modular enclosure assembly for terminals wiring and distribution.

2. Description of the State of Art

There are known various enclosures for terminating wires from outlets and for distribution wires for voice, data and video in residences, offices and factories. Such enclosures are used in new installations and retrofits and can be surface—mounted or recessed by mounting between wall studs. For example, LEVITON INTEGRATED NETWORK manufactures Series 280 & 420 Structured Media™ Enclosures of metal sheet; SUTTLE SOHO ACCESS manufactures SOHO Access™ Dual Door solution, made of metal in different sizes: 14", 21", 28" and 42"; and PRIMEX MANUFACTURING produces a polymer SMART HOME ENCLOSURE with inside dimensions: H: 30", W: 14.0" and D: 3.5".

As can be seen, LEVITON INTEGRATED NETWORK and SUTTLE SOHO ACCESS manufacture metal enclosures for several dimensions, while PRIMEX MANUFACTURING'S enclosure, restricted by the size of the molding equipment, is basically limited to the above dimensions. Acquiring a larger molding equipment for extended enclosures could constitute a relative high investment, justified only when the market requirement for large enclosures is significant.

Attempts have been made to eliminate or at least to alleviate the foregoing shortcomings. Thus, U.S. Pat. No. 8,212,144, granted on Jul. 3, 2012 to Gretz for a "GANGABLE MODULAR ELECTRICAL BOX ASSEMBLY WITH INTERLOCKING MODULES" have addressed the problem.

Gretz's patent discloses an assembly including separate modules that can be combined to provide a desired amount of electrical enclosures on a wall. The modules are combined to form a two-gang, three-gang, or larger ganged box box. In the simplest configuration, two end modules can be combined to obtain a two-gang electrical box.

The disadvantages of Gretz's assembly are the following:
a) it is mainly used as a box for electrical outlets and is relatively small;
b) since the fixtures captured inside the box are intended to be pendent, there are no flat walls or other surfaces with open and blind circular apertures for disposing and securing by snaps and screws those fixtures; and
c) the overlapping arrangements, for interlocking each pair of adjacent modular structures, project from the walls inside the assembly, thereby preventing or, at least, diminishing the availability of wall surfaces.

II. SUMMARY OF THE INVENTION

A first objective of the modular enclosure assembly for terminals wiring and distribution, according to the present invention; is to use molding equipment of relatively limited size to solve the needs for small, medium and large enclosures.

A second objective of the present invention is to use, for combining adjacent subassemblies, interpenetrating structures extending beneath back base plate; thus, the working surface of the latter is entirely free and available for attachment of electric and electronic devices.

A third objective of this invention is to provide apertures into the back base plate, for securing to the latter all-purpose electric and electronic devices, disposed inside the enclosure assembly;

A further objective is to produce sturdy enclosure assemblies with high mechanical strength, good fire retardation and good electric insulation proprieties.

Another objective is to use polymers for the enclosures assemblies in order to avoid interference with wireless transmissions.

Yet another objective is to provide ready made insertions for extension of the assemblies.

Broadly stating, the modular enclosure assembly for terminals wiring and distribution, according to the present invention, comprises An upper and lower enclosure subassemblies, vertically disposed, both of plastic, and basically built to be removably and vertically connected by a partial interpenetration.

A hinged panel subassembly used, for each one of the upper and lower enclosure subassemblies, to open/expose their inner space and to prevent access to the latter.

The upper enclosure subassembly constitutes a unitary structure that incorporates a back base plate of rectangular shape, defined by an upper margin, a pair of lateral margins and a lower margin; and an inverted U-shape frame extending from the upper margin and from the pair of lateral margins of the back base plate; the inverted U-shape frame and the back base plate form a monobloc structure.

The back base plate comprises: a plurality of open circular apertures, sized and spaced for attaching by snapping a variety of modules and a series of blind circular apertures, extending into vertical and horizontal intersecting rows, for attaching different electronic devices. A first interpenetrating zone is located at an end of a lower left side of the back base plate and is delimited at its bottom by a first horizontal segment continued by an outwardly inclined ascending segment, both segments being parts of the lower margin. The first interpenetrating zone is provided with back projecting pins. A second interpenetrating zone is located at at an end of a lower right side of the back base plate and is juxtaposed with the first interpenetrating zone and is delimited by the outwardly inclined ascending segment, which is commonly shared with the first interpenetrating zone, and by a second horizontal segment that extends laterally rightwards from an upper end of the outwardly inclined ascending segment. The second interpenetrating zone incorporates a slat partially superposed on a rear surface of the back base plate where and with which it forms a monoblock structure and from which the slat extends downwardly, beyond said rear surface of the back base plate. A lowest end of the slat terminates above a lowest end of the first interpenetrating zone. The slat, beyond the rear surface of the back base plate, is provided with centering orifices commensurate diametrically with the back projecting pins.

said inverted U-shape frame incorporating outwardly, along its outside periphery—a front facing channel adaptable to receive a gasket and a feature of said hinged panel subassembly;

at the top—a horizontal elongated flat segment provided with several exit distribution ports formed as feed-through circular knockouts;

projecting forward from said back base plate—one vertical elongated flat segment, located at the left and another vertical elongated flat segment—at the right, each of those being provided with a) at least one auxiliary cut-out; said vertical elongated flat segment located at the left comprising, proximate its lower end and facing an interior of said upper enclosure subassembly, a horizontal, rectangular elongate depression;

said lower enclosure subassembly, constituting also a unitary structure as said upper enclosure subassembly, comprises said back base plate that is structurally identical with that included in said upper enclosure subassembly, except a positional difference which resides in the fact that said back base plate of said lower enclosure subassembly is rotated at 180 degrees with respect to said back base plate of said upper enclosure subassembly;

said lower enclosure subassembly further comprising a U-shape frame extending out, frontwards from said back base plate; the differences between said inverted U-shape frame and said U-shape frame reside in the fact: that at the bottom, said U-shape frame comprises a horizontal elongated flat segment provided with several entry ports formed as knockouts ports; that laterally, said vertical elongated flat segment located at the left and said vertical elongated flat segment located at the right, both of said inverted U-shape frame, are positionally interchanged, i.e. said vertical elongated flat segment located at the left is replaced by said vertical elongated flat segment located at the right and vice versa;

said hinged panel subassembly incorporating: a inverted U-shape structure for encompassing said upper enclosure subassembly and having an upper horizontal section that extends downwards into left and right vertical sections, both provided with perforations for flush attaching to a wall; a profile including an edge projecting inwards and shaped and sized to fit into said front facing channel; said left vertical section near its end being provided with a indented area, parallel retracted with respect to a corresponding upper surface of said profile; further said indented area is provided horizontally, starting from its top, with a perforated cylinder having stepwise discontinuities in diameter and extending backwards beneath said indented area; said right vertical section terminates at its lower end, with respect to said lower end of said said vertical elongated flat segment, located at the right, with an extended portion of said profile having a length equal with a length of said indented area; said extended portion being internally, opposed said indented area, somewhat depressed, so that when said extended portion and said indented area are superposed, said extended portion has its upper profile coextensive with said profile; a pin extends inward from said extended portion and is provided with a recess hole, said pin being so chosen that it easy fits into said perforated cylinder belonging to a following U-shape structure and is so adapted that a screw is able to connect said pin and said perforated cylinder;

a U-shape structurea for encompassing said lower enclosure subassembly, which is a mirror image of said inverted U-shape structure that encompasses said upper enclosure subassembly; and a pair of pivoting panels of identical design and conventional type is used; each of said pair of pivoting panels being provided with usual features for opening/closing, said usual features interacting with corresponding ones of said inverted U-shape structure and of said U-shape structure.

In one aspect, the present invention comprises:

beyond the lowest part of the vertical elongated flat segment, situated at the left, outside front facing channel, a first annular-eyelet unitary the said vertical elongated flat segment, situated at the left, extending from the latter and having an exterior surface flush with an exterior surface of the front facing channel;

into the vertical elongated flat segment, situated at the right of the back base plate, at an upper end of the second interpenetrating zone and coplanar with the second horizontal segment—a second annular-eyelet provided beneath it with a horizontal, circular open aperture; the second annular-eyelet being vertically so retracted with respect to the first annular-eyelet that it can be inserted under the latter of the lower enclosure subassembly and adapted to be joined by a tightening fixture;

a catch is located at an end of a tongue with which forms a unitary part projecting outwards and downward from the lowest internal surface of said vertical elongated flat, situated at the right; and when said upper and lower enclosure subassemblies are joined together, said catch snaps into said horizontal, rectangular elongate depression of said lower enclosure.

In another aspect of this invention, an extended modular enclosure assembly derived from the enclosure assembly comprises the upper and lower enclosure subassemblies, the hinged panel subassembly for the upper enclosure subassembly, the hinged panel subassembly for the lower enclosure subassembly and one or more intermediary enclosure subassemblies can be intercalated between the upper and lower enclosure subassemblies;

an intermediary enclosure subassembly incorporating a rear base plate, similar to the back base plate used in the upper and lower enclosure subassemblies, said rear base plate, at the top, includes the first interpenetrating zone and the second interpenetrating zone, positionally interchanged with respect to the first interpenetrating zone and the second interpenetrating zone, both situated at a lower end of the back base plate of the upper enclosure subassembly; thus, a complementarity between opposite zones can be achieved;

at the bottom, the rear base plate includes the first interpenetrating zone and the second interpenetrating zone, positionally interchanged with respect to first interpenetrating zone and second interpenetrating zone, both situated at an upper end of the back base plate of the lower enclosure subassembly; thus, a interpenetration compatibility between opposite zones can be achieved; and use is made of the lateral vertical elongated flat segment situated at the left and the lateral vertical elongated flat segment situated at the right (no use being made of the horizontal elongated flat segment as in the inverted U-shape frame and of the horizontal elongated flat segment as in said U-shape frame.

III. BRIEF DESCRIPTION OF THE DRAWINGS

The subject matter of the invention is particularly pointed out and distinctively claimed in the concluding portion of the specification. The invention, however, both in structure and operation may be better understood by reference to the following description taken in conjunction with the subjoined claims and the accompanying drawings of which:

IV. DESCRIPTION OF THE PREFERRED EMBODIMENTS

The accompanying drawings, as above described, illustrate a preferred embodiment of a modular enclosure assembly for terminals wiring and distribution (data, video and voice wiring for a single residence, a multiple dwelling unit or commercial premises). This preferred embodiment is generally designated with numeral 10. For convenience, in the following disclosure, the foregoing enclosure assembly will be named "enclosure assembly 10".

As a caveat, it is to be agreed, that terms, such as "upper", "lower", "front", "back", "vertical", "horizontal", "upward", "downward" and "outward" are conventionally employed in the present specification with reference to the normal position in which enclosure assembly 10 will be used.

Figure 1:
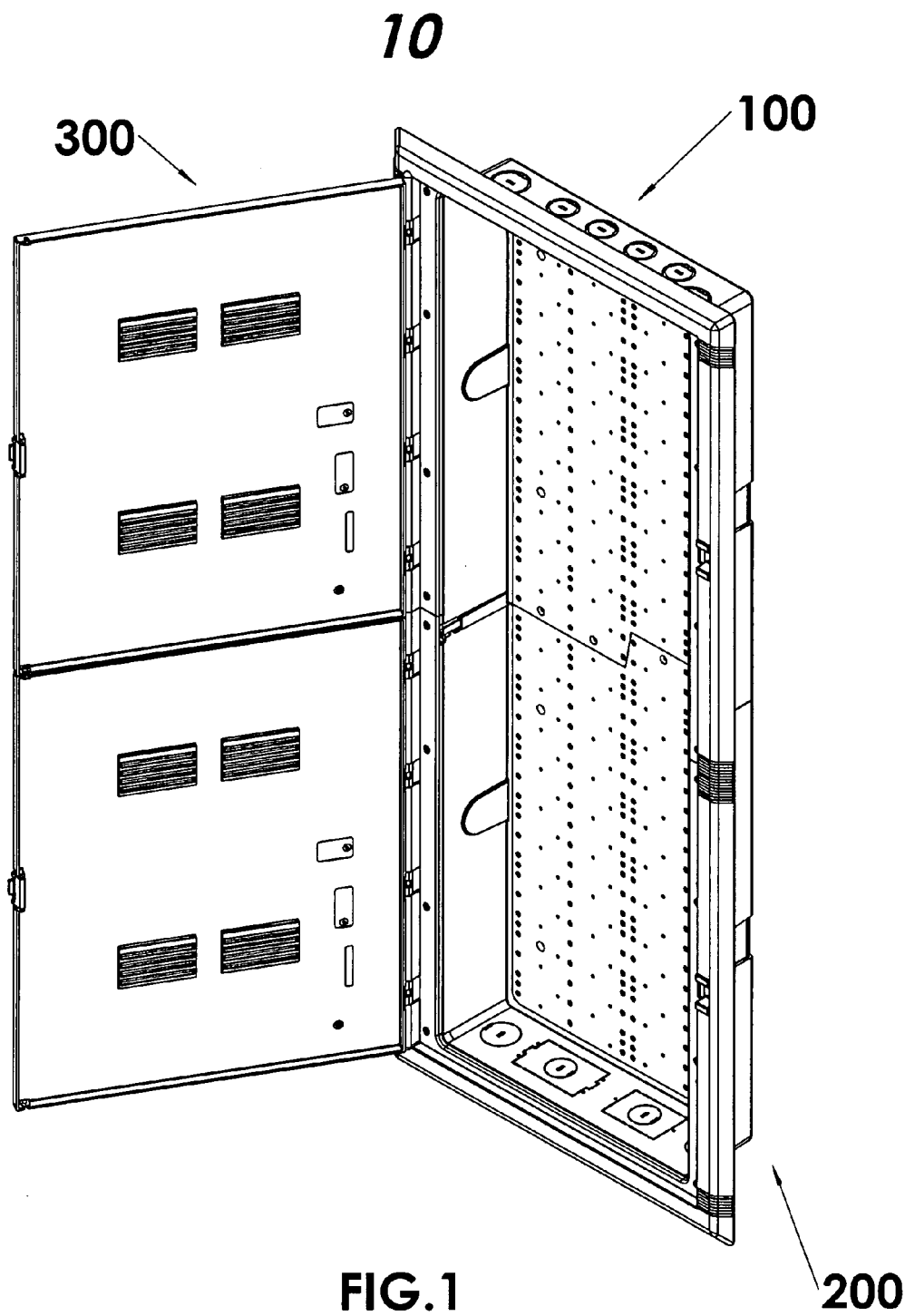
FIG. 1 is an axonometric projection of an enclosure assembly conform the present invention.
Figure 2:
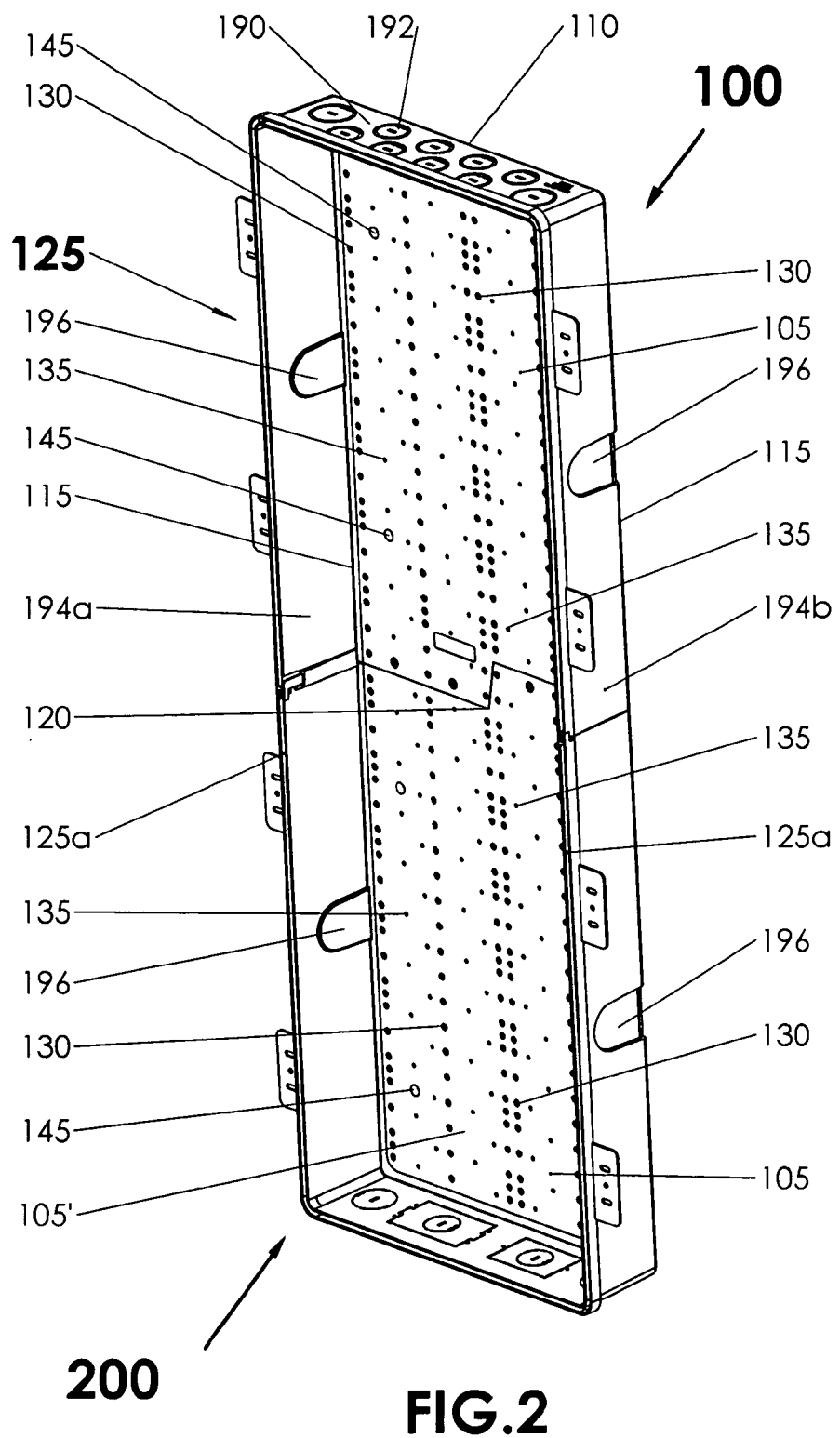
FIG. 2 is a reproduction of FIG. 1 shown without the hinged panel subassembly.
Figure 3:
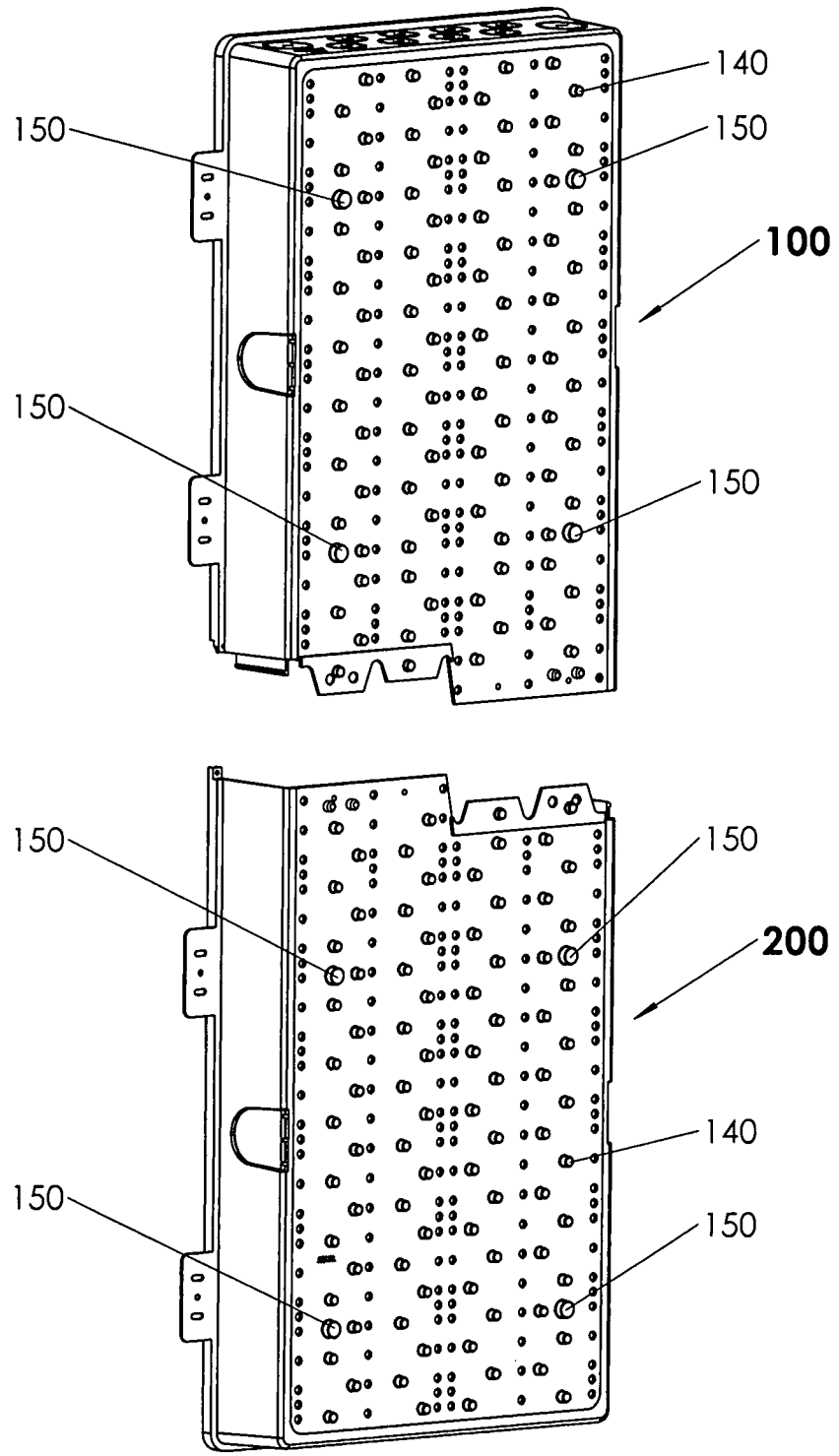
FIG. 3 is an exploded back view of FIG. 2.
Figure 4:
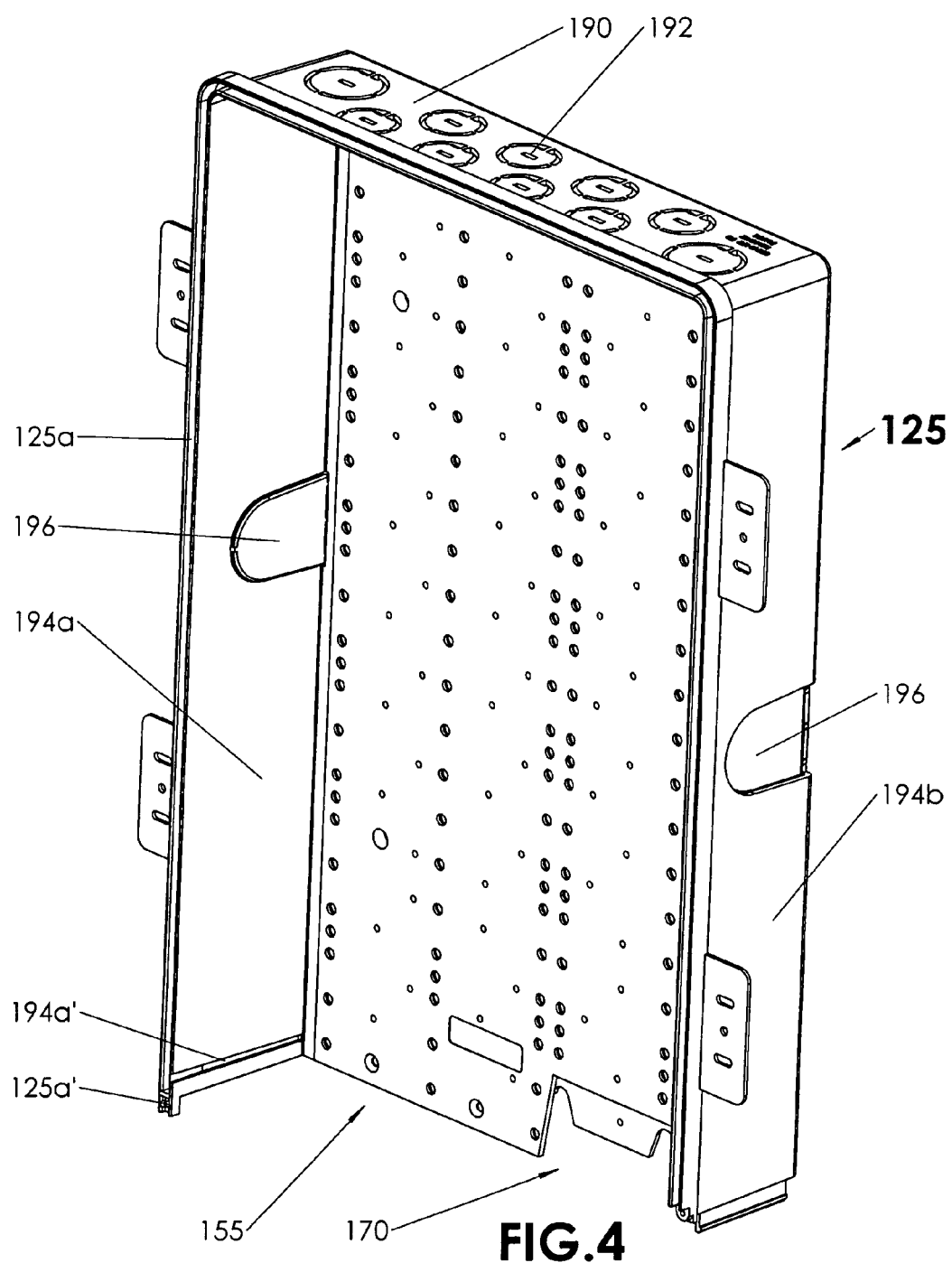
FIG. 4 is an axonometric projection of an upper enclosure subassembly, shown without its corresponding upper part of the hinged panel subassembly.
Figure 5:
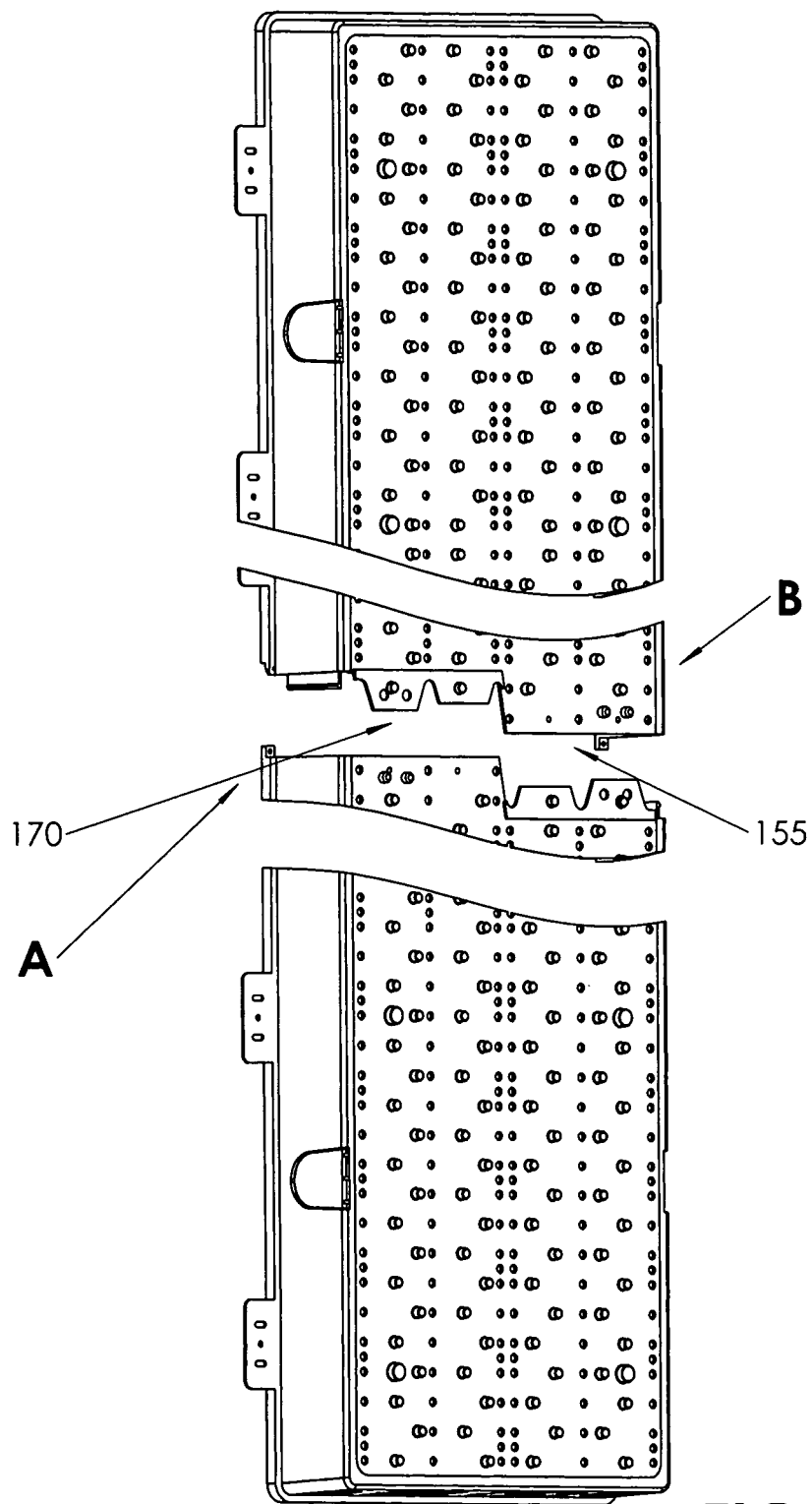
FIG. 5 is a reproduction of FIG. 3, shown with an upper fragment A ruptured from the upper enclosure subassembly and a lower fragment B ruptured from the lower enclosure subassembly.
Figure 6:
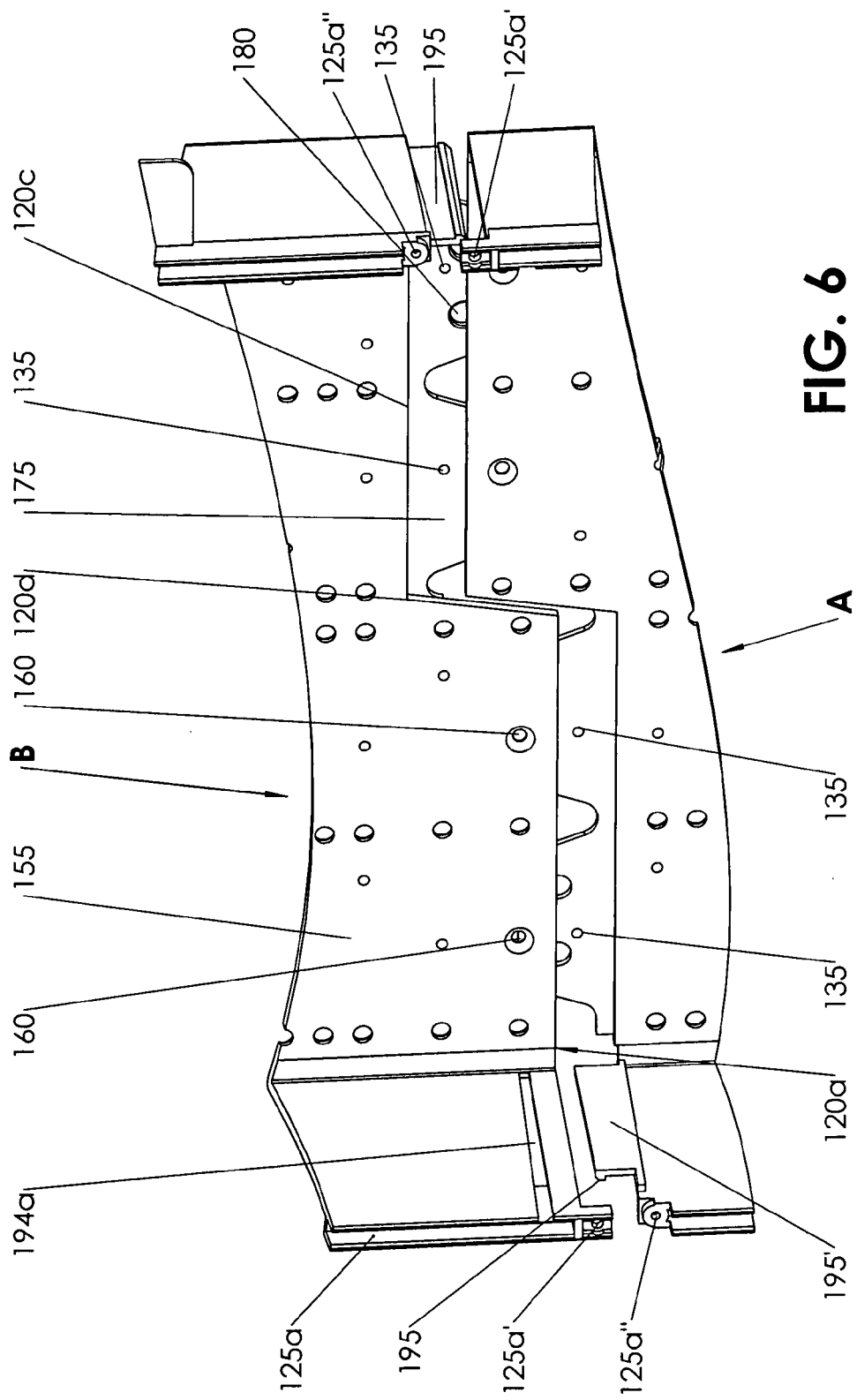
FIG. 6 depicts front axonometric projections of upper and lower fragments A and B pointed out in FIG. 5.
Figure 7:
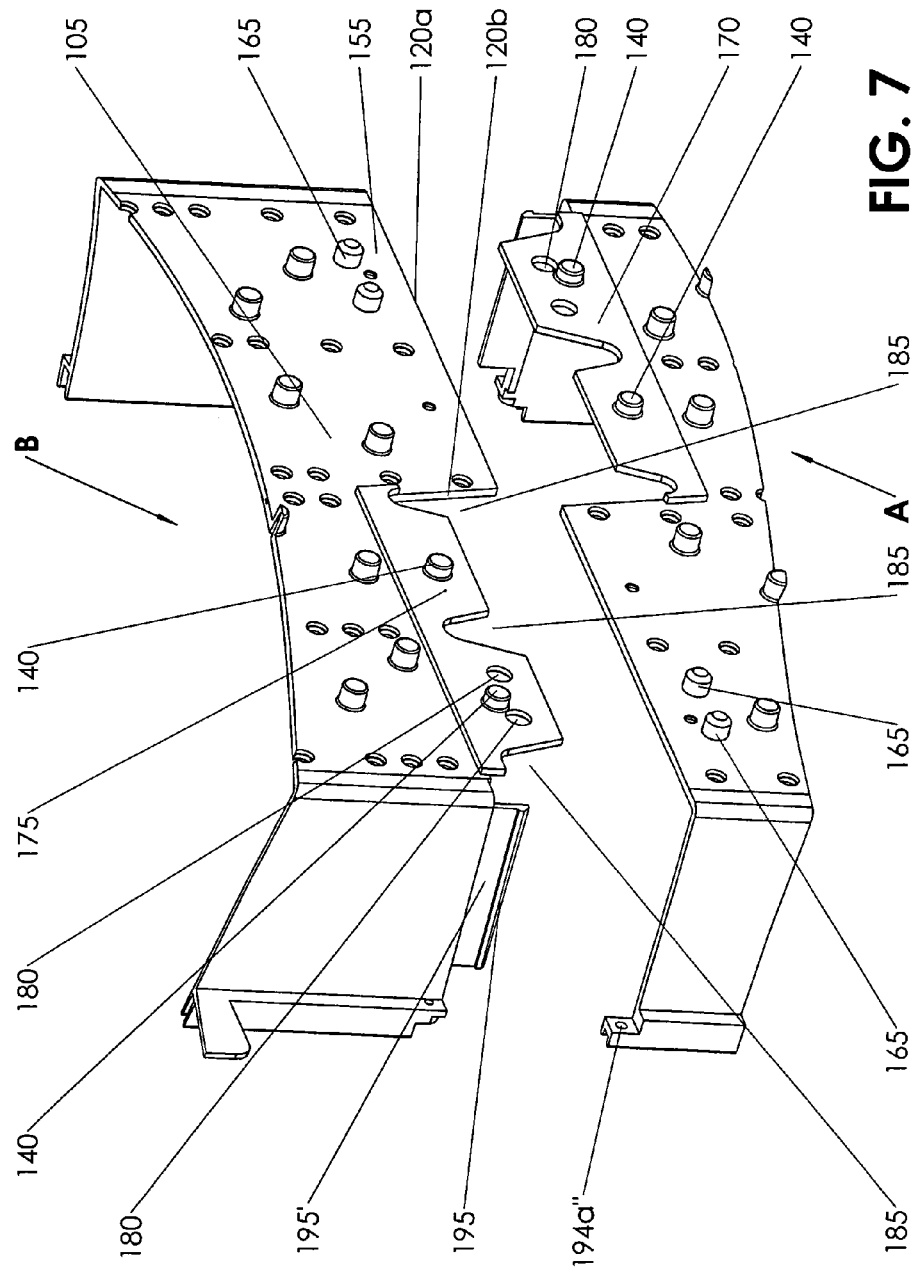
FIG. 7 is a back view of FIG. 6.
Figure 8:
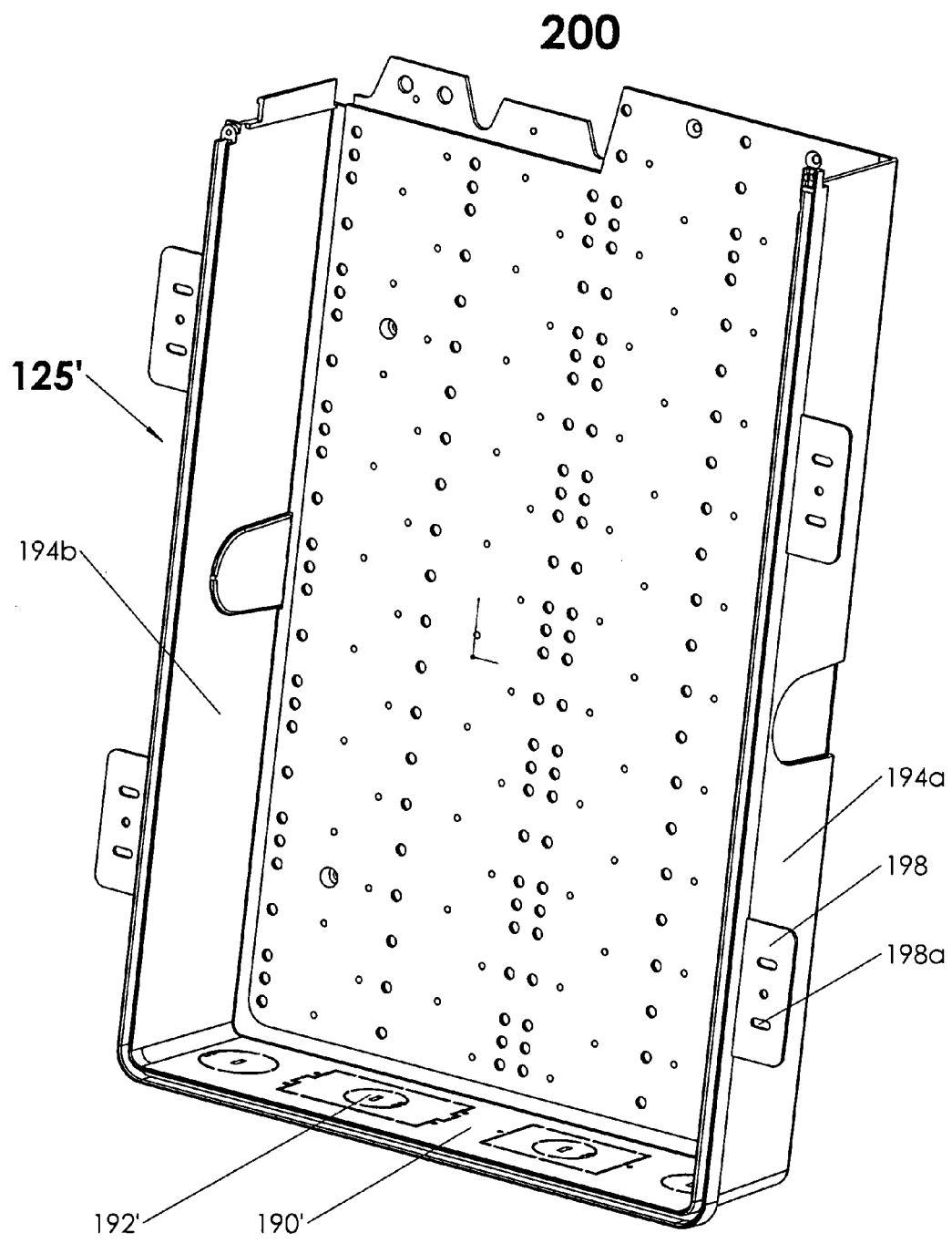
FIG. 8 is an axonometric projection of a lower enclosure subassembly, shown without its corresponding lower part of the hinged panel subassembly.
Figure 9:
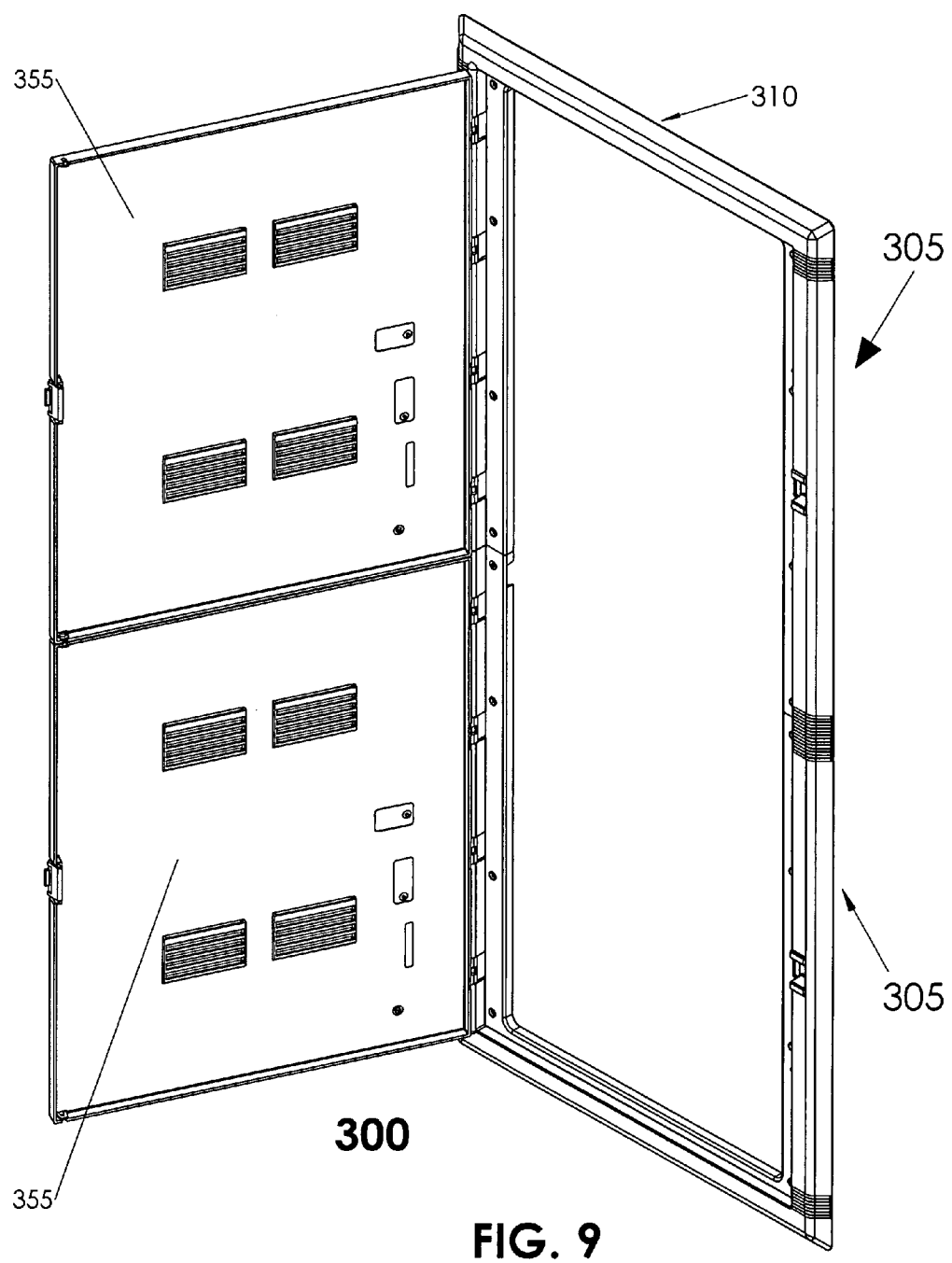
FIG. 9 is a front axonometric projection the hinged panel subassembly, shown in an open position.
Figure 10:
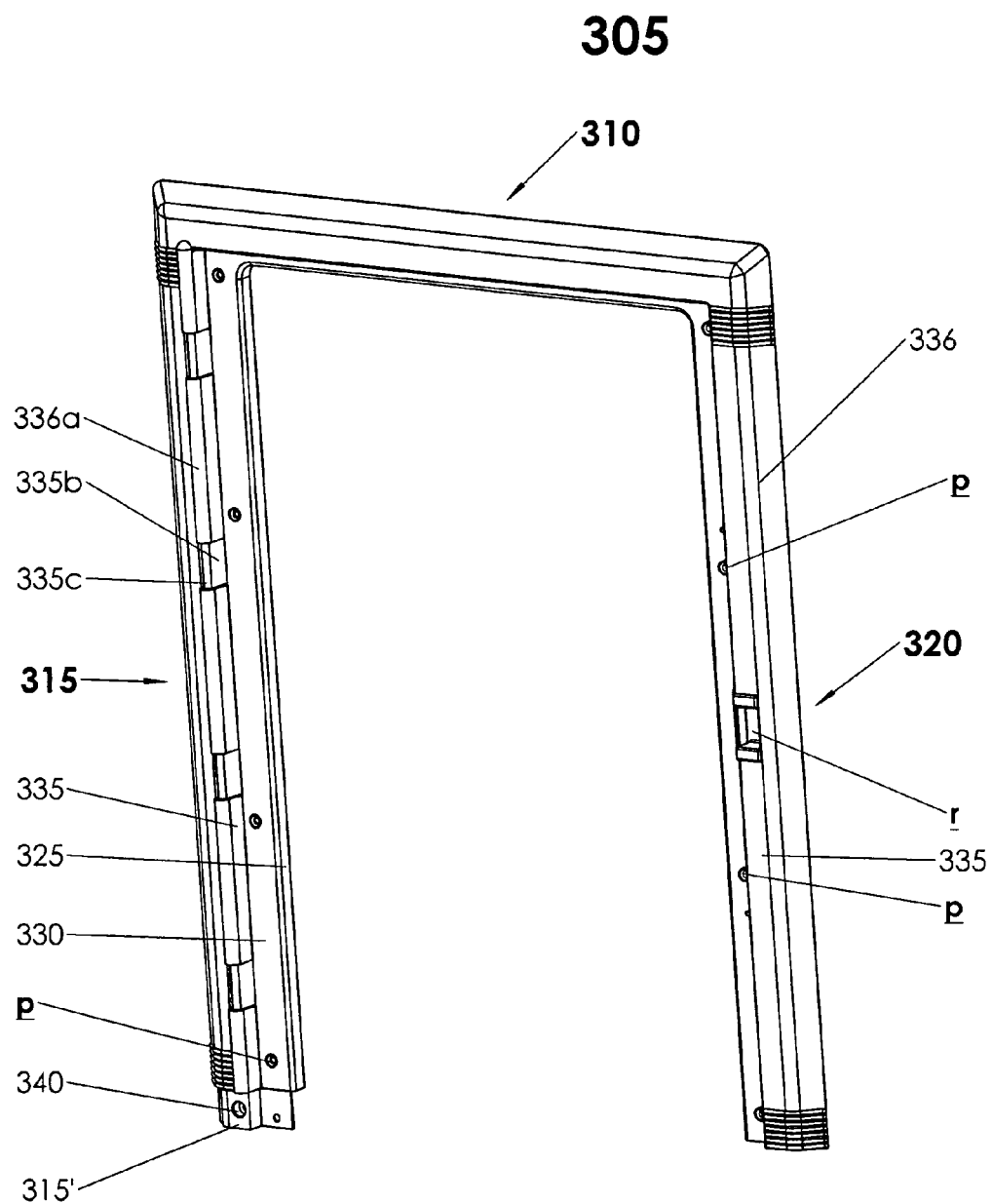
FIG. 10 is a front axonometric projection of an upper part of the hinged panel subassembly, which part incorporates a inverted U-shape structure and is shown without the pivoting panel.
Figure 11:
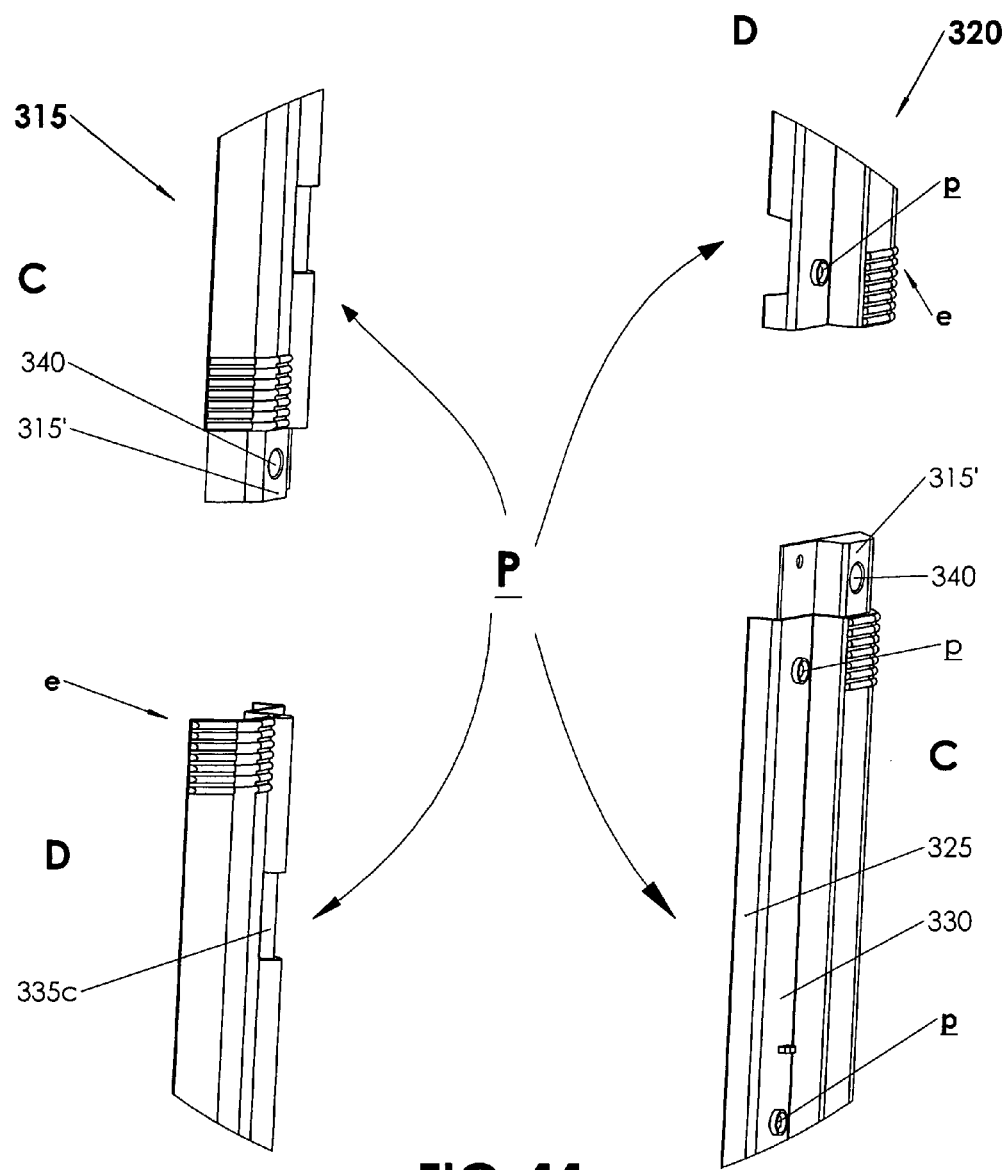
FIG. 11 is a back view of FIG. 10.
Figure 12:
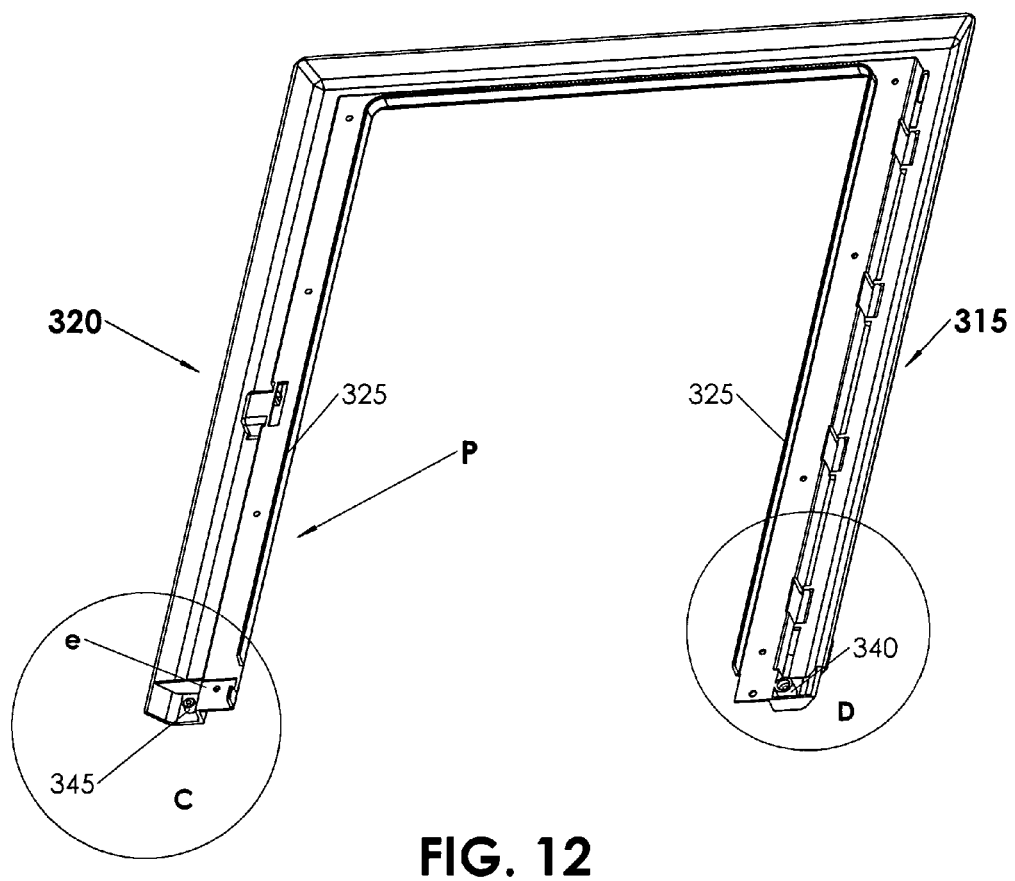
FIG. 12 is an exploded, front axonometric projection of segments C and D ruptured, respectively, from the inverted U-shape structure and from the U-shape structure; their complementarity is illustrated.
Figure 13:
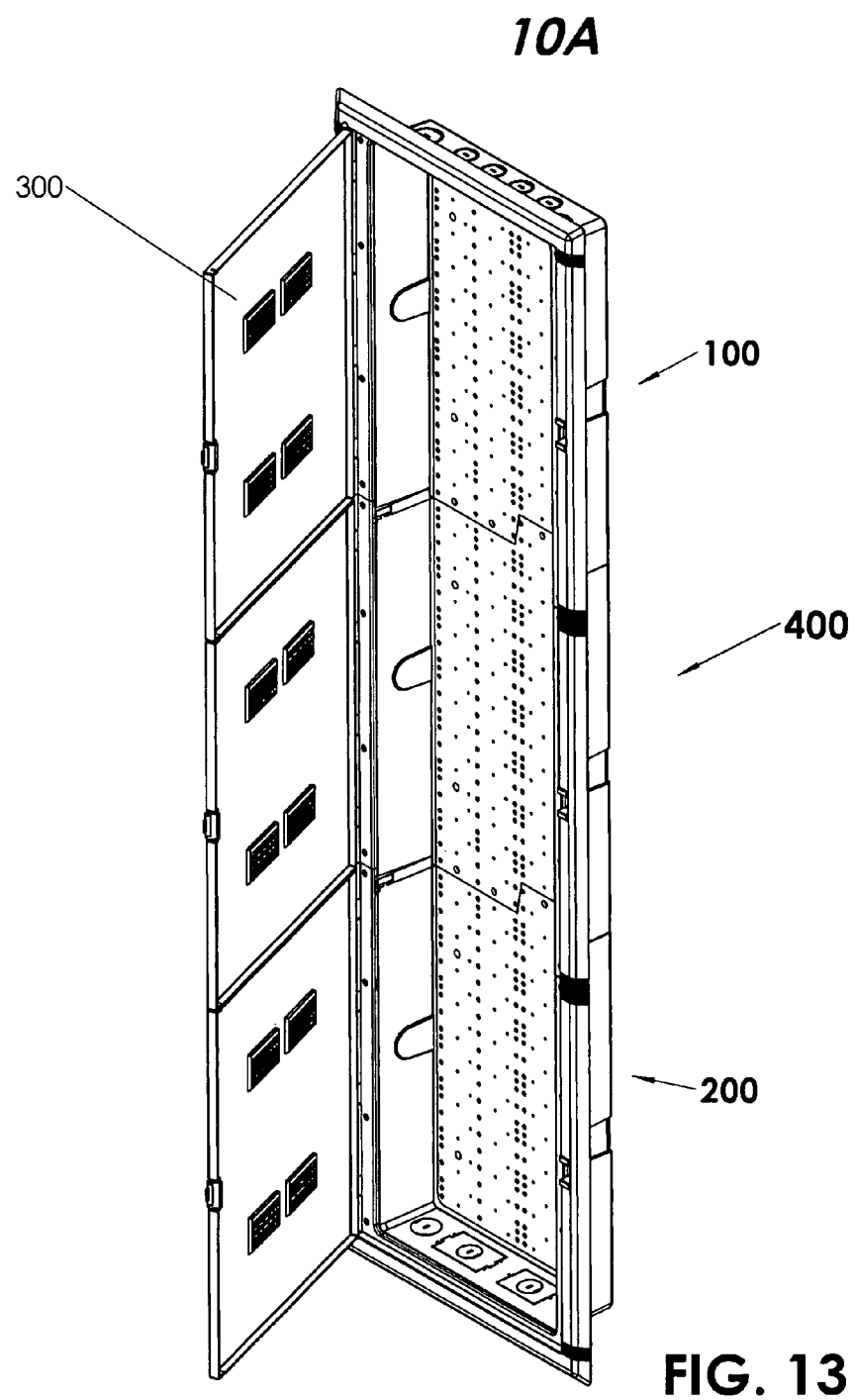
FIG. 13 is an axonometric projection of a modular enclosure assembly that incorporates one intermediary enclosure subassembly.
Figure 14:
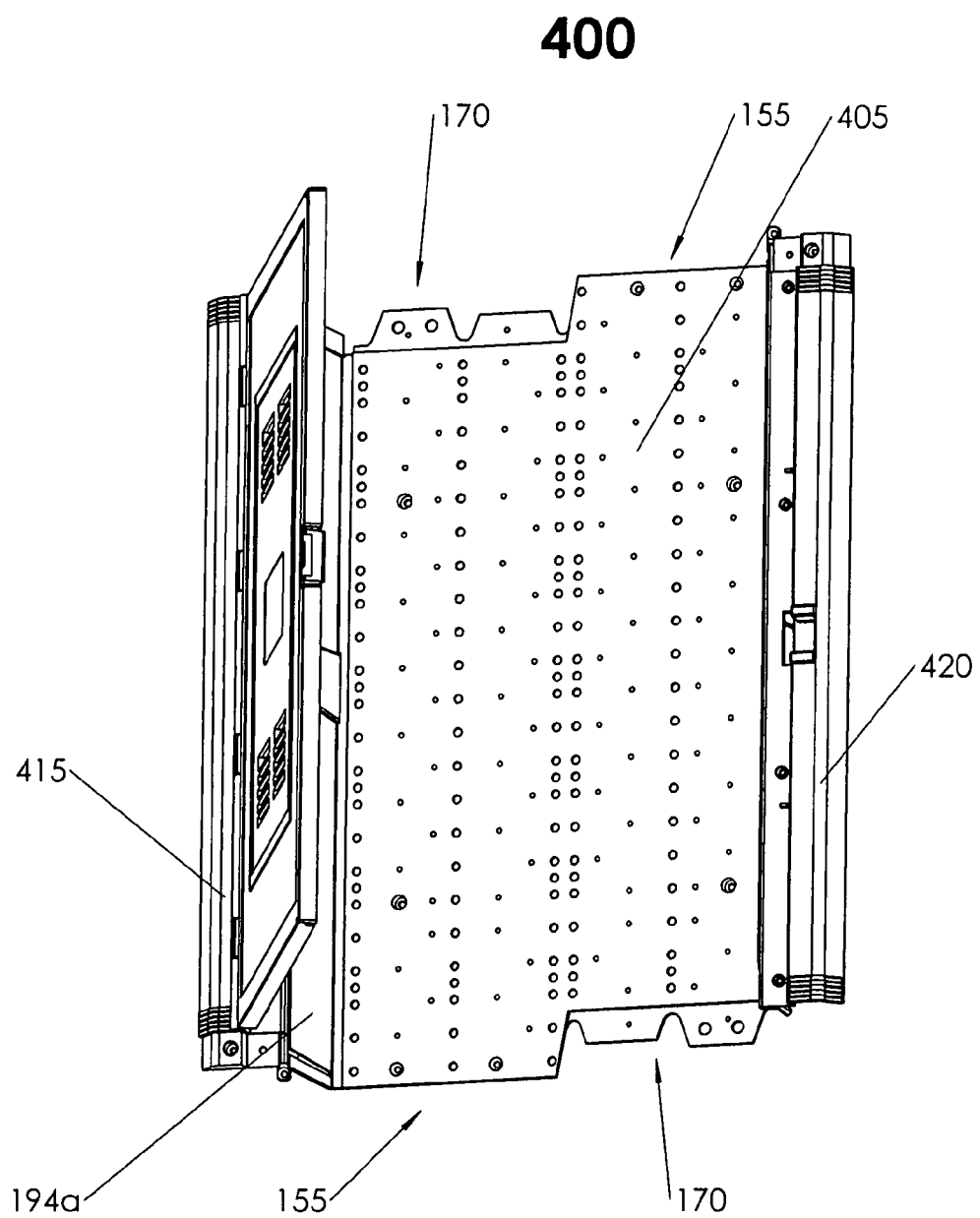
FIG. 14 is an axonometric projection of a intermediary enclosure subassembly.
Figure 15:
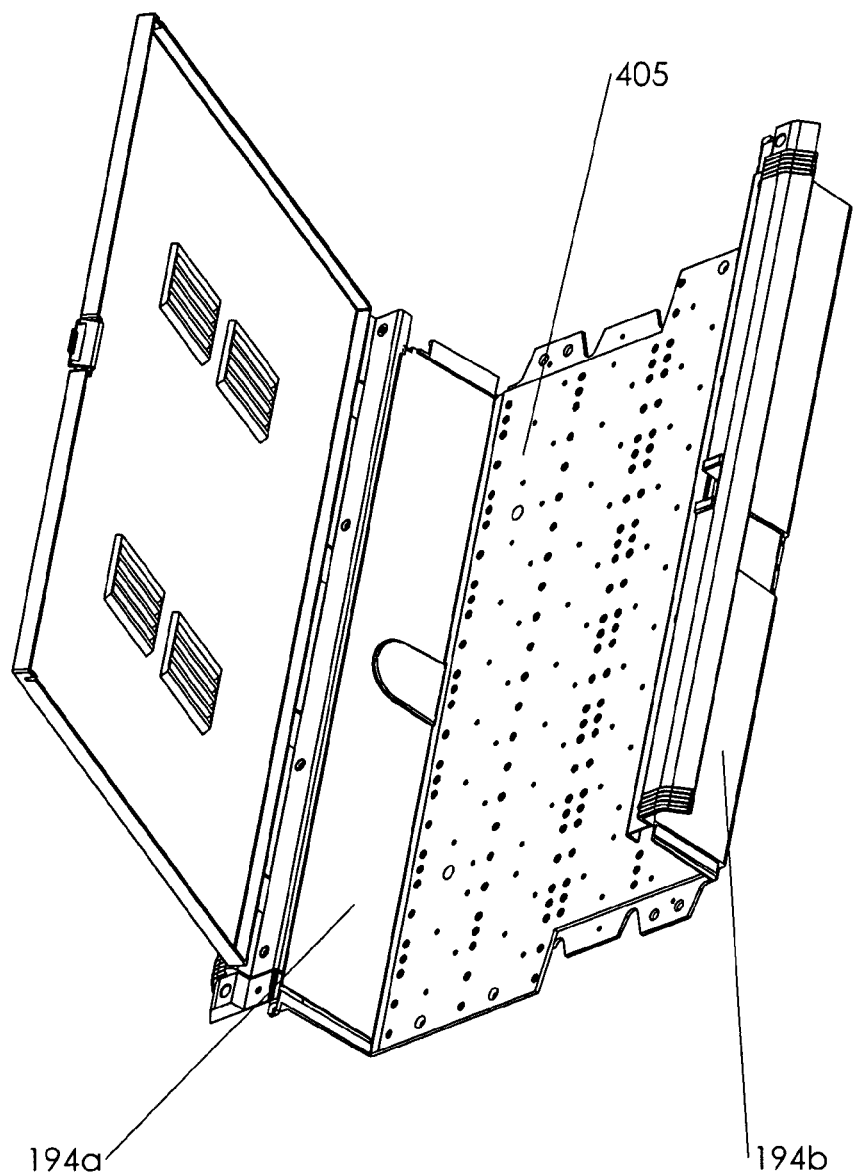
FIG. 15 illustrates FIG. 14 seen from a different angle.
Figure 16:
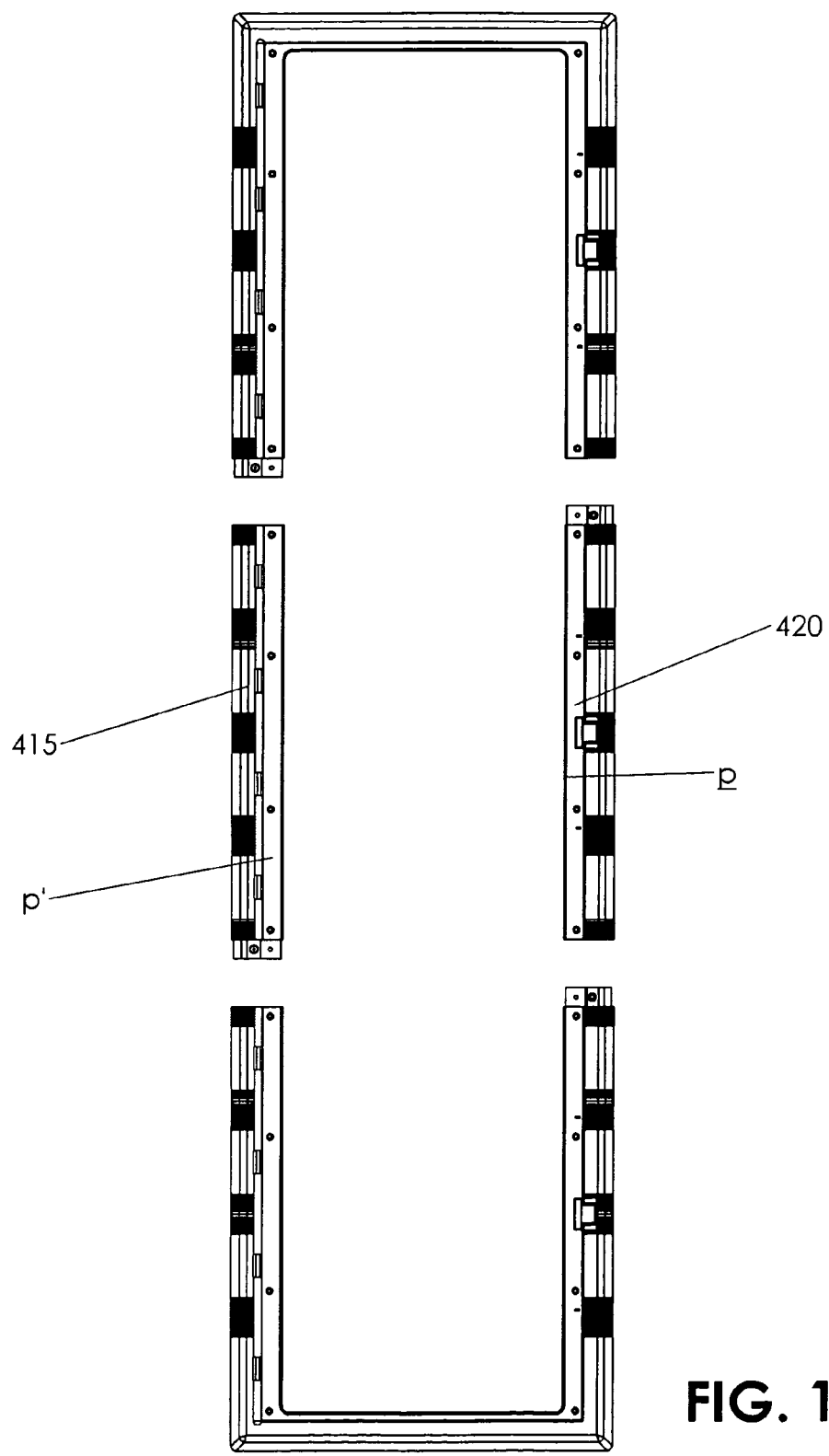
FIG. 16 is an exploded, front axonometric projection the intermediary enclosure subassembly, shown without pivoting panels.

Broadly describing, with reference to FIGS. 1 through 16, a first embodiment of enclosure assembly 10 structurally incorporates, in combination, an upper and lower enclosure subassemblies 100 and 200, both of plastic, which are built to be removably and vertically connected by a partial interpenetration. Enclosure assembly 10, which is defined by an inner space, further comprises a hinged panel subassembly 300 structured to open/expose the inner space and to prevent access to the latter.

Upper enclosure subassembly 100 constitutes a unitary structure that incorporates a back base plate 105 of rectangular shape, defined by an upper margin 110, a pair of lateral margins 115 and a lower margin 120.

An inverted U-shape frame 125 extends from upper margin 110 and from the pair of lateral margins 115 of back base plate 105. Inverted U-shape frame 125 and back base plate 105 form a monoblock structure.

Back base plate 105 incorporates a plurality of open circular apertures 130 disposed in vertical and horizontal intersecting rows. The distances between open circular apertures 130 are chosen to accommodate the attachment of a variety of modules (not shown), intended for different purposes and having different sizes and configurations. The modules are provided with snap pins (also not shown) generally standardized as shape, size and distance between them. Horizontal distance between two snap pins is 6" or 3" and vertical distance is 1.5".

Back base plate 105 incorporates as well a series of blind circular apertures 135 disposed in vertical and horizontal intersecting rows. Blind circular apertures 135 extend horizontally and backward from the rear of back base plate 105 into cylindrical protrusions 140. The series of blind circular apertures 135 is used for attaching different electronic devices.

Back base plate 105 also incorporates four indented blind holes 145 provided with recesses for countersunk screws. The four indented blind holes 145 are symmetrically located with respect to the vertical and horizontal axes of symmetry (both not shown) of back base plate 105. The four indented blind holes 145 extend horizontally and backward from the rear of back base plate 105 into cylindrical protuberances 150. The four indented blind holes 145 and cylindrical protuberances 150 are made to be pierced by screws (not shown) when surface or recess-attaching upper subassembly 100.

Back base plate 105 ends at its lower left side with a first interpenetrating zone 155 delimited at its bottom by a first horizontal segment 120a continued by an outwardly inclined ascending segment 120b, both segments 120a and 120b being parts of lower margin 120. First interpenetrating zone 155 is provided with a pair of indented, open apertures 160 provided with recesses for countersunk screws. The pair of indented, open apertures 160 is so positioned as to coaxially coincide with a pair of apertures from the series of blind circular apertures 135 of lower enclosure subassembly 200. For a correct and easy attachment of upper and lower enclosure subassemblies 100 and 200, first interpenetrating zone 155 is provided with a pair of back projecting pins 165 with chamfered ends.

The pair of back projecting pins 165 is inserted (further disclosed in the present specification) into lower enclosure subassembly 200.

Back base plate 105 ends at its lower right side with a second interpenetrating zone 170 juxtaposed with first interpenetrating zone 155. First and second interpenetrating zones 155 and 170 can be, as well, so designed that they are positionally interchanged with respect to that enclosure subassembly to which they intrinsically belong (first interpenetrating zone 155 at the right and second interpenetrating zone 170 at the left), and both have relatively reduced dimensions with respect to back plate 105. Second interpenetrating zone 170 is delimited by outwardly inclined ascending segment 120b, which is commonly shared with first interpenetrating zone 155 and by a second horizontal segment 120c. The latter extends laterally rightwards from an upper end 120d of outwardly inclined ascending segment 120b.

Second interpenetrating zone 170 incorporates a slat 175 having the shape of a flat element, partially superposed on a rear surface of back plate 105 (tangent to it) where and with which it forms a monoblock structure and from which it extends downwardly (beyond rear surface of back plate 105). The lowest end of slat 175 terminates above the lowest end of first interpenetrating zone 155.

Slat 175, beyond the rear surface of back plate 105, is provided with a pair of centering orifices 180 commensurate diametrically with the pair of back projecting pins 165. When upper and lower enclosure subassemblies 100 and 200 are joined together, the pair of centering orifices 180 is so located as to allow the insertion into it of the pair of back projecting pins 165.

Slat 175, beyond its contact surface with a rear of back plate 105, is also provided with a pair of blind circular apertures 135 and their cylindrical protrusions 140; the former and the latter belonging to the series of blind circular apertures 135 and their corresponding cylindrical protrusions 140, evidently fulfill the same role.

Slat 175, beyond its contact surface with a rear of back plate 105, is provided as well with spaced indentations 185, located behind several corresponding open circular apertures 130 belonging to the plurality of open circular apertures 130. The purpose of spaced indentations 185 is to accommodate snap pins of modules when the latter are attached on a first interpenetrating zone 155 of a lower enclosure subassembly 200, situated at the left of back plate 105, above second interpenetrating zone 170 of first enclosure subassembly 100.

As can be seen there is a complementarity between a first interpenetrating zone 155 of an upper enclosure subassembly 100 and a second interpenetrating zone 170 of a lower enclosure subassembly 200, and vice versa.

Inverted U-shape frame 125 incorporates:
1) outwardly, along its outside periphery—a front facing channel 125a adaptable to receive a gasket (not shown) and a feature of hinged panel subassembly 300 (further disclosed);
2) at the top—a horizontal elongated flat segment 190 provided with several exit distribution ports 192 formed as feed-through circular knockouts;
3) laterally, projecting forward—one vertical elongated flat segment 194a, located at the left and—another vertical elongated flat segment 194b at the right, each of those being provided with a) at least one auxiliary cut-out 196 adaptable for various uses;
into vertical elongated flat segment 194a, located at the left, proximate its end and facing the interior of upper enclosure subassembly 100—a horizontal, rectangular elongate depression 194a';
beyond the lowest part of vertical elongated flat segment 194a, outside front facing channel 25a, vertical elongated flat segment 194a extends into a first annular-eyelet with an exterior surface flush with an exterior surface of said front facing channel;
into vertical elongated flat segment 194b, situated at the right of back plate 105, at an upper end of second interpenetrating zone 170 and coplanar with second horizontal segment 120c—a second annular-eyelet 125a" provided beneath it with a horizontal, circular open aperture 194a"; second annular-eyelet 125a" is vertucally so retracted with respect to first annular-eyelet 125a' that it can be inserted under the latter of a lower enclosure subassembly 200 (when upper and lower subassemblies 100 and 200 are interconnected using a screw (not shown)); and catch 195 located at an end of a tongue 195' form together a unitary part projecting outwards and downward from the lowest internal surface of vertical elongated flat 194b; when upper and lower enclosure subassemblies 100 and 200 are joined together, catch 195 snaps into horizontal, rectangular elongate depression 194a' of lower enclosure subassembly 200.

Lower enclosure subassembly 200 constitutes a unitary structure that incorporates:
back base plate 105 structurally identical with that included in upper enclosure subassembly 100, except a positional difference which resides in the fact that back base plate 105 of lower enclosure subassembly 200 is rotated at 180 degrees with respect to the one of upper enclosure subassembly 100;
a U-shape frame 125' extending out, frontwards from back base plate 105, the former and the latter forming a monoblock; the differences between inverted U-shape frame 125 and U-shape frame 125' reside in the following:
at the bottom—U-shape frame 125' comprises a horizontal elongated flat segment 190' provided with several entry ports 192' formed as knockouts ports;
laterally,—vertical elongated flat segment 194a located at the left and—vertical elongated flat segment 194b located at the right, both of inverted U-shape frame 125, are positionally interchanged, i.e. vertical elongated flat segment 194a located at the left is replaced by vertical elongated flat segment 194b located at the right and vice versa;
prior to interconnection of upper and lower enclosure subassemblies 100 and 200 via screws (not shown) and catches 195, upper and lower enclosure subassemblies 100 and 200 are initially spaced, then so translated as to bring back projecting pins 165 of one of the enclosure subassemblies 100 and 200 in a coincidental position with centering orifices 180 of another one of enclosure subassemblies and, then, enclosure subassemblies 100 and 200, respectively their back base plates 105 and 105' are brought together in a vertical plane, and then, secured.

A pair of brackets 198 extends outside from each vertical elongated flat segments 194a and 194b, from behind front facing, laterally extending channel 125a; the pair of brackets 198 includes perforations 198a intended to be used for securing upper and lower enclosure subassemblies 100 and 200 to wall studs via screws (the former and the latter not shown).

Hinged panel subassembly 300 incorporates:
a inverted U-shape structure 305 for encompassing upper enclosure subassembly 100 and having
1) an upper horizontal section 310 that extends downwards into left and right vertical sections 315 and 320, both provided with perforations p for flush attaching to a wall;
2) a profile P resulting from a combination of the following successive, elongate, intersecting elements:
an edge 325 projecting inwards and shaped and sized to fit into front facing channel 125a;
a flat contacting segment 330 extending outside an extremity of edge 325, which extremity does not penetrate into front facing channel 125a, and which is intended to contact an exterior of front facing channel 125a;
a surrounding element 335 extending outwardly from and perpendicularly on flat contacting segment 330; and
a curvilinear segment 336 projecting from an outside end of surrounding element 335; outside periphery of curvilinear segment 336 is coplanar with flat contacting segment 330; a convex area 336a is formed along left vertical section 315, by starting from surrounding element 335 and extending into curvilinear segment 336; convex area 336a is provided with several rectangular windows 335b in which vertical pins 335c for hinges are permanently secured;
right vertical section 320, in its middle, is provided with a snap lock perforation r which extends into flat contacting segment 330 and surrounding element 335;
lower end of left vertical section 315 and lower end of vertical elongated flat segment 194a, located at the left, terminate into horizontal planes; left vertical section 315 near its end is provided with a indented area 315' parallel retracted with respect to a corresponding upper surface of left vertical section 315 (except edge 325); indented area 315' is provided horizontally, starting from its top, with a perforated cylinder 340 having stepwise discontinuities in diameter and extending backwards beneath indented area 315';

right vertical section 320 ends downwards, with respect to lower end of vertical elongated flat segment 194b located at the right, with an extended portion e of profile P having a length equal with indented area 315';

extended portion e is internally, opposed indented area 315', somewhat depressed, so that when the former and the latter are superposed, extended portion e has its upper profile P coextensive with profile P of a reminder of right vertical section 320; a pin 345 extends inward from extended portion e and is provided with a recess hole, the external diameter of pin 345 being so chosen that it easy fits into perforated cylinder 340 of a following U-shape structure (further described); a screw (not shown) connects pin 345 and perforated cylinder 340;

a U-shape structure 350 for encompassing lower enclosure subassembly 200 which is a mirror image of a inverted U-shape structure 305 for encompassing upper enclosure subassembly 100; and a pair of pivoting panels 355 of identical design and conventional type is used; each of the pair of pivoting panels 355 is provided with usual features for pivoting and for opening/closing, which features interact with corresponding ones of inverted U-shape structure 305 and of U-shape structure 350.

As can be seen, there is the same complementarity between indented area 315' and extended portion e of profile P of a inverted U-shape structure 305 or between indented area 315' and extended portion e of profile P of a inverted U-shape structure 305a with the former and latter of a vertically following U-shape structure 350 (when joining the former with the latter). Obviously, there is possible to design an inverted U-shape structure 305 with an indented area 315' located at the right and extended portion e of profile P located at the left.

Consequently, there is an optional interchangeability between relative position of indented area 315' and extended portion e of profile P, as long as their complementarity with opposed, corresponding parts is maintained.

The foregoing disclosure describes and illustrates how enclosure assembly 10 constitutes an embodiment which serves as well as a basis for modular variants.

An extended modular enclosure assembly 10A derived from enclosure assembly 10 comprises upper and lower enclosure subassemblies 100 and 200, a hinged panel subassembly 300 for, upper enclosure subassembly 100 and another hinged panel subassembly 300 for lower enclosure subassemblies 200 and one or more intermediary enclosure subassemblies 400 can be intercalated between upper and lower enclosure subassemblies 100 and 200.

Intermediary enclosure subassembly 400 incorporates a rear base plate 405, similar to back base plate 105 used in upper and lower enclosure subassemblies 100 and 200, except the following differences:

at the top, rear base plate 405 includes a first interpenetrating zone 155 and a second interpenetrating zone 170, positionally interchanged with respect to first interpenetrating zone 155 and second interpenetrating zone 170, both situated at a lower end of back base plate 105 of upper enclosure subassembly 100; thus, a complementarity between opposite zones can be achieved;

at the bottom, rear base plate 405 includes a first interpenetrating zone 155 and a second interpenetrating zone 170, positionally interchanged with respect to first interpenetrating zone 155 and second interpenetrating zone 170, both situated at an upper end of back base plate 105 of lower enclosure subassembly 200; thus, a interpenetration compatibility between opposite zones can be achieved; and use is made of a lateral vertical elongated flat segment 194a situated at the left and a lateral vertical elongated flat segment 194b situated at the right, but no use is made of a horizontal elongated flat segment 190, as in inverted U-shape frame 125, and of a horizontal elongated flat segment 190' as in U-shape frame 125'.

An extended modular enclosure assembly 10A incorporates as well one or more hinged intermediary panel subassemblies 400, each comprising vertical, opposed left and right sections 415 and 420, both provided with perforations p for flush attaching to a wall; the only difference between a hinged panel subassembly 300 and a hinged intermediary panel subassembly 400 resides in the fact that the latter does not incorporate an upper horizontal section 310 as in inverted U-shape structure 305 and in U-shape structure 305, the latter being a mirror image of the former.

To intercalate and secure a hinged intermediary panel subassembly 400 between and to a pair of hinged panel subassemblies 300, use is made of complementary connections corresponding to connections used in the pair of hinged panel subassemblies 300 of upper and lower enclosure subassemblies 100 and 200.

The embodiments of the invention in which an exclusive property or privilege is claimed are defined as follows:

1. A modular enclosure assembly for terminals wiring and distribution incorporating, in combination,
   an upper and lower enclosure subassemblies, vertically disposed, both of plastic, and built to be removably and vertically connected by a partial interpenetration;
   a hinged panel subassembly used, for each one of said upper and lower enclosure subassemblies, to open/expose their inner space and to prevent access to the latter;
   said upper enclosure subassembly constituting a unitary structure that incorporates a back base plate of rectangular shape, defined by an upper margin, a pair of lateral margins and a lower margin; and
   an inverted U-shape frame extending from said upper margin and from said pair of lateral margins of said back base plate, said inverted U-shape frame and said back base plate forming a mono-bloc structure;
   said back base plate comprising: a plurality of open circular apertures, sized and spaced for attaching by snapping a variety of modules;
   a series of blind circular apertures, extending into vertical and horizontal intersecting rows, for attaching different electronic devices;
   a first interpenetrating zone at an end of its lower left side, delimited at its bottom by a first horizontal segment continued by an outwardly inclined ascending segment, both said segments being parts of said lower margin;
   said first interpenetrating zone being provided with back projecting pins;
   a second interpenetrating zone at an end of its lower right side, juxtaposed with said first interpenetrating zone and delimited by said outwardly inclined ascending segment, which is commonly shared with said first interpenetrating zone, and by a second horizontal segment that extends laterally rightwards from an upper end of said outwardly inclined ascending segment;

said second interpenetrating zone incorporating a slat partially superposed on a rear surface of said back base plate where and with which it forms a mono-block structure and from which said slat extends downwardly, beyond said rear surface of said back base plate, a lowest end of said slat terminating above a lowest end of said first interpenetrating zone; said slat, beyond the rear surface of said back base plate, being provided with centering orifices commensurate diametrically with said back projecting pins;

said inverted U-shape frame incorporating outwardly, along its outside periphery,—a front facing channel adaptable to receive a gasket and a feature of said hinged panel subassembly;

at the top—a horizontal elongated flat segment provided with several exit distribution ports formed as feed-through circular knockouts; projecting forward from said back base plate—one vertical elongated flat segment, located at the left and another vertical elongated flat segment—at the right, each of those being provided with a) at least one auxiliary cut-out; said vertical elongated flat segment located at the left comprising, proximate its lower end and facing an interior of said upper enclosure subassembly, a horizontal, rectangular elongate depression; said lower enclosure subassembly, constituting also a unitary structure as said upper enclosure subassembly, comprises said back base plate that is structurally identical with that included in said upper enclosure subassembly, except a positional difference which resides in the fact that said back base plate of said lower enclosure subassembly is rotated at 180 degrees with respect to said back base plate of said upper enclosure subassembly;

said lower enclosure subassembly further comprising a U-shape frame extending out, frontwards from said back base plate; the differences between said inverted U-shape frame and said U-shape shape frame reside in the fact that at the bottom, said U-shape frame comprises a horizontal elongated flat segment provided with several entry ports formed as knockouts ports, that laterally, said vertical elongated flat segment located at the left and said vertical elongated flat segment located at the right, both of said inverted U-shape frame, are positionally interchanged, i.e. said vertical elongated flat segment located at the left is replaced by said vertical elongated flat segment located at the right and vice versa; said hinged panel subassembly incorporating: a inverted U-shape structure for encompassing said upper enclosure subassembly and having an upper horizontal section that extends downwards into left and right vertical sections, both provided with perforations for flush attaching to a wall; a profile including an edge projecting inwards and shaped and sized to fit into said front facing channel; said left vertical section near its end being provided with an indented area, parallel retracted with respect to a corresponding upper surface of said profile; further said indented area is provided horizontally, starting from its top, with a perforated cylinder having stepwise discontinuities in diameter and extending backwards beneath said indented area; said right vertical section terminates at its lower end, with respect to said lower end of said vertical elongated-flat segment, located at the right, with an extended portion of said profile having a length equal with a length of said indented area; said extended portion being internally, opposed said indented area, somewhat depressed, so that when said extended portion and said indented area are superposed, said extended portion has its upper profile coextensive with said profile; a pin extends inward from said extended portion and is provided with a recess hole, said pin being so chosen that it easy fits into said perforated cylinder belonging to a following U-shape structure and is so adapted that a screw is able to connect said pin and said perforated cylinder;

a U-shape structure for encompassing said lower enclosure subassembly, which is a mirror image of said inverted U-shape structure that encompasses said upper enclosure subassembly; and a pair of pivoting panels of identical design and conventional type is used; each of said pair of pivoting panels being provided with usual features for opening/closing, said usual features interacting with corresponding ones of said inverted U-shape structure and of said U-shape structure.

2. The modular assembly, as defined in claim 1, further comprising:

beyond the lowest part of said vertical elongated flat segment, situated at the left, outside front facing channel, a first annular-eyelet unitary with said vertical elongated flat segment, situated at the left, extending from the latter and having an exterior surface flush with an exterior surface of said front facing channel; into said vertical elongated flat segment, situated at the right of said back base plate, at an upper end of said second interpenetrating zone and coplanar with said second horizontal segment—a second annular-eyelet provided beneath it with a horizontal, circular open aperture; said second annular-eyelet being vertically so retracted with respect to said first annular-eyelet that it can be inserted under the latter of said lower enclosure subassembly and adapted to be joined by a tightening fixture;

a catch is located at an end of a tongue with which forms a unitary part projecting outwards and downward from the lowest internal surface of said vertical elongated flat, situated at the right; and when said upper and lower enclosure subassemblies are joined together, said catch snaps into said horizontal, rectangular elongate depression of said lower enclosure.

3. The modular assembly, as defined in claim 1 or claim 2, wherein:

an extended modular enclosure assembly derived from said enclosure assembly comprises said upper and lower enclosure subassemblies, said hinged panel subassembly for said upper enclosure subassembly, said hinged panel subassembly for said lower enclosure subassembly and one or more intermediary enclosure subassemblies can be intercalated between said upper and lower enclosure subassemblies;

an intermediary enclosure subassembly incorporating a rear base plate, similar to said back base plate used in said upper and lower enclosure subassemblies, said rear base plate, at the top, includes said first interpenetrating zone and said second interpenetrating zone, positionally interchanged with respect to said first interpenetrating zone and said second interpenetrating zone, both situated at a lower end of said back base plate of said upper enclosure subassembly; thus, a complementarity between opposite zones can be achieved;

at the bottom, said rear base plate includes said first interpenetrating zone and said second interpenetrating zone, positionally interchanged with respect to first interpenetrating zone and second interpenetrating zone, both situated at an upper end of said back base plate of said lower enclosure subassembly; thus, a interpenetration compatibility between opposite zones can be achieved; said intermediary enclosure subassembly further including said lateral vertical elongated flat segment situated at the left and said lateral vertical elongated flat segment situated at the right, said horizontal elongated flat segment as in said inverted U-shape frame and of said horizontal elongated flat segment as in said U-shape frame being eliminated.

* * * * *

UNITED STATES PATENT AND TRADEMARK OFFICE
Certificate

Patent No. 8,680,407 B2                                              Patented: March 25, 2014

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: James Chun-Nam Chan, Richmond (CA); and Mahmud Harji, Surrey (CA).

Signed and Sealed this Twenty-sixth Day of August 2014.

TIMOTHY THOMPSON
*Supervisory Patent Examiner*
Art Unit 2847
Technology Center 2800